United States Patent
Montgomery et al.

(10) Patent No.: US 12,224,764 B2
(45) Date of Patent: Feb. 11, 2025

(54) TIMING SIGNAL DIAGNOSTIC SYSTEM

(71) Applicant: Dell Products L.P., Round Rock, TX (US)

(72) Inventors: Colin Montgomery, Mountain View, CA (US); Per Henrik Fremrot, Novato, CA (US); Maunish Shah, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 167 days.

(21) Appl. No.: 18/180,933

(22) Filed: Mar. 9, 2023

(65) Prior Publication Data

US 2024/0305309 A1    Sep. 12, 2024

(51) Int. Cl.
*H03M 1/12* (2006.01)
*H03M 1/14* (2006.01)
*H03M 1/36* (2006.01)

(52) U.S. Cl.
CPC ......... *H03M 1/1285* (2013.01); *H03M 1/145* (2013.01); *H03M 1/361* (2013.01); *H03M 1/12* (2013.01)

(58) Field of Classification Search
CPC ...... H03M 1/1285; H03M 1/12; H03M 1/145; H03M 1/361
See application file for complete search history.

(56) References Cited

U.S. PATENT DOCUMENTS

2003/0051557 A1* 3/2003 Ishikawa ................. G01F 1/588
                                                  73/861.12

* cited by examiner

Primary Examiner — Joseph J Lauture
(74) Attorney, Agent, or Firm — Joseph Mencher

(57) ABSTRACT

A timing signal diagnostic system includes a chassis housing an input system that receives a timing signal, a timing system that receives the timing signal from the input system, an analog-to-digital converter system that receives the timing signal from the input system, and a processing system that is coupled to the timing system and the analog-to-digital converter system. The processing system uses the timing system to output reference time signals to the analog-to-digital converter system that are based on the timing signal, and uses the analog-to-digital converter system to sample the timing signal based on the reference time signals over a plurality of different timing signal cycles. Based on the sampling of the timing signal, the processing system generates a waveform for the timing signal, and provides a timing signal diagnostic result based on the waveform for the timing signal.

20 Claims, 15 Drawing Sheets

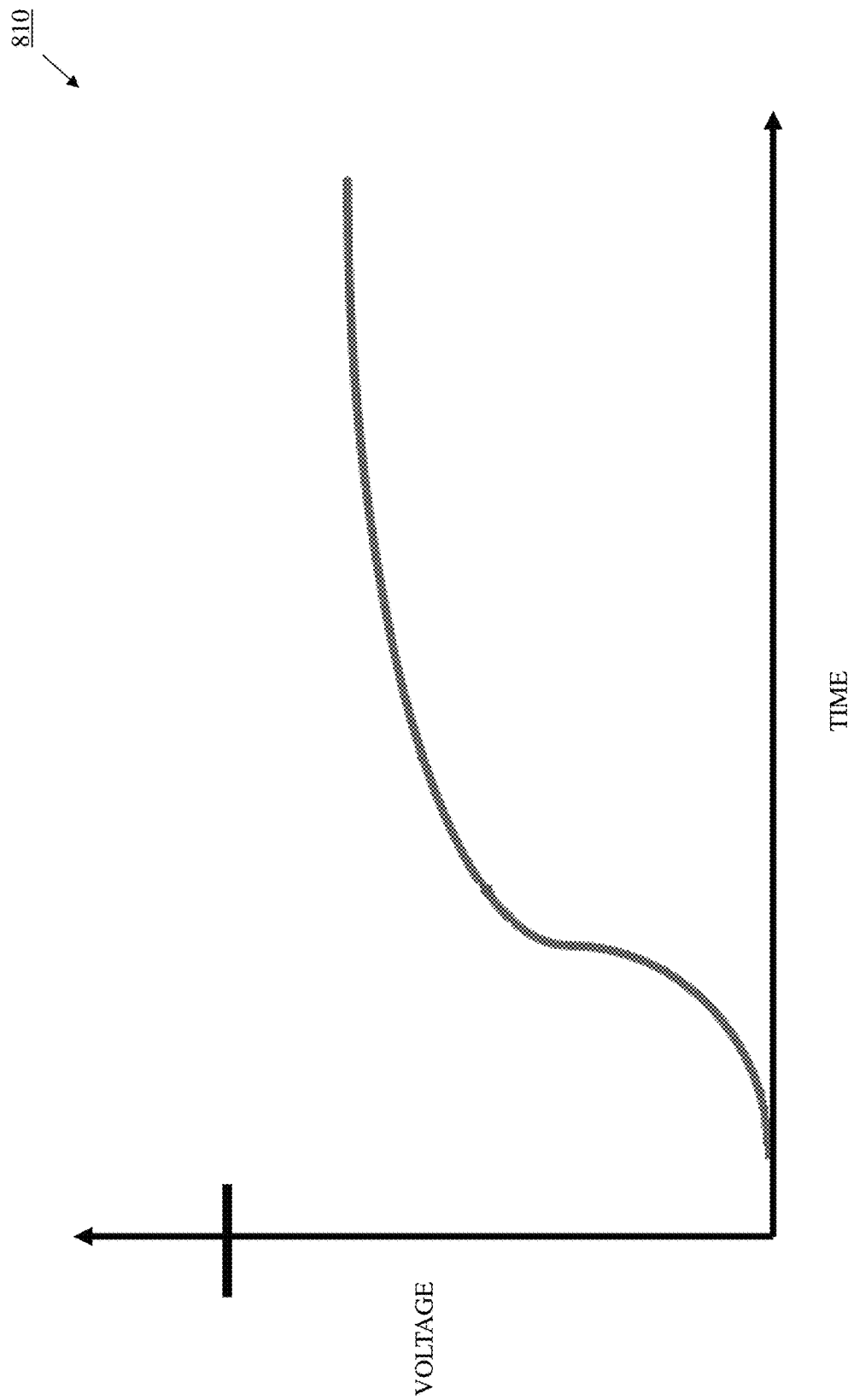

TIMING SIGNAL DIAGNOSTIC SYSTEM

BACKGROUND

The present disclosure relates generally to information handling systems, and more particularly to a diagnostic system for timing signals used with information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, networking devices (e.g., switch devices, router devices, etc.), and/or other computing devices known in the art, sometimes require a precise and highly accurate time reference for use in their operation. For example, computing devices used in $5^{th}$ Generation (5G) wireless systems utilize such time references to synchronize 5G base stations, computing devices used in high frequency trading systems utilize such time references to time stamp trading events, computing devices in edge computing systems utilize such time references to align edge computing devices, while computing devices may also use such time references for a variety of advanced telemetry operations. Such timing references may be provided in computing devices via timing ports configured according to the G.703 standard promulgated in 2016 by the International Telecommunication Union (ITU) Telecommunication Standardization Sector (ITU-T), which one of skill in the art in possession of the present disclosure will appreciate may be physically implemented as SubMiniature version A (SMA) connectors, SubMiniature version B (SMB) connectors, SubMiniature version C (SMC) connectors, RJ-45 connectors, and/or via other physical implementations that may depend on the space available in/on the computing device.

However, such timing references depend on the quality of the timing signal received via the timing port, and failed equipment, bad cabling, relatively long cabling, bad installations, and/or other issues known in the art can result in relatively low-quality timing signals at the timing port that can result in a failure of the timing reference (i.e., a timing reference that is off by more than a threshold amount). Furthermore, the timing reference for a computing device may be sufficient when the computing device is initially deployed, but may subsequently fail due to, for example, a lack of margin in the quality of the timing signal (e.g., when an ideal margin provides a "high" signal at 1V and a "low" signal at 0V but the actual margin provides a "high" signal at 0.6V and a "low" signal at 0.4V, when a desired time rise is not achieved, etc.). Failure of the timing reference often results in repair and/or replacement of the computing device, and may require a network administrator or other technician to go to the physical location of the computing device to test the timing signal (e.g., by connecting an oscilloscope to the timing cabling). As such, the diagnosis of timing signal issues that may result in failure of a timing reference is costly and time consuming.

Accordingly, it would be desirable to provide a timing signal diagnostic system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a timing signal diagnostic engine that is configured to: output, to an analog-to-digital converter system that is included in a chassis with the processing system using a timing system that is included in the chassis with the processing system, reference time signals that are based on a timing signal that is received by the timing system from an input system that is included in the chassis with the processing system; sample, using the analog-to-digital converter system and based on the reference time signals over a plurality of different timing signal cycles, the timing signal that is received by the analog-to-digital converter system from the input system; generate, based on the sampling of the timing signal, a waveform for the timing signal; and provide, based on the waveform for the timing signal, a timing signal diagnostic result.

BRIEF DESCRIPTION OF THE DRAWINGS

FIG. 8F is a graph view illustrating an embodiment of results of the operation of computing device of FIG. 2 during the method of FIG. 3.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
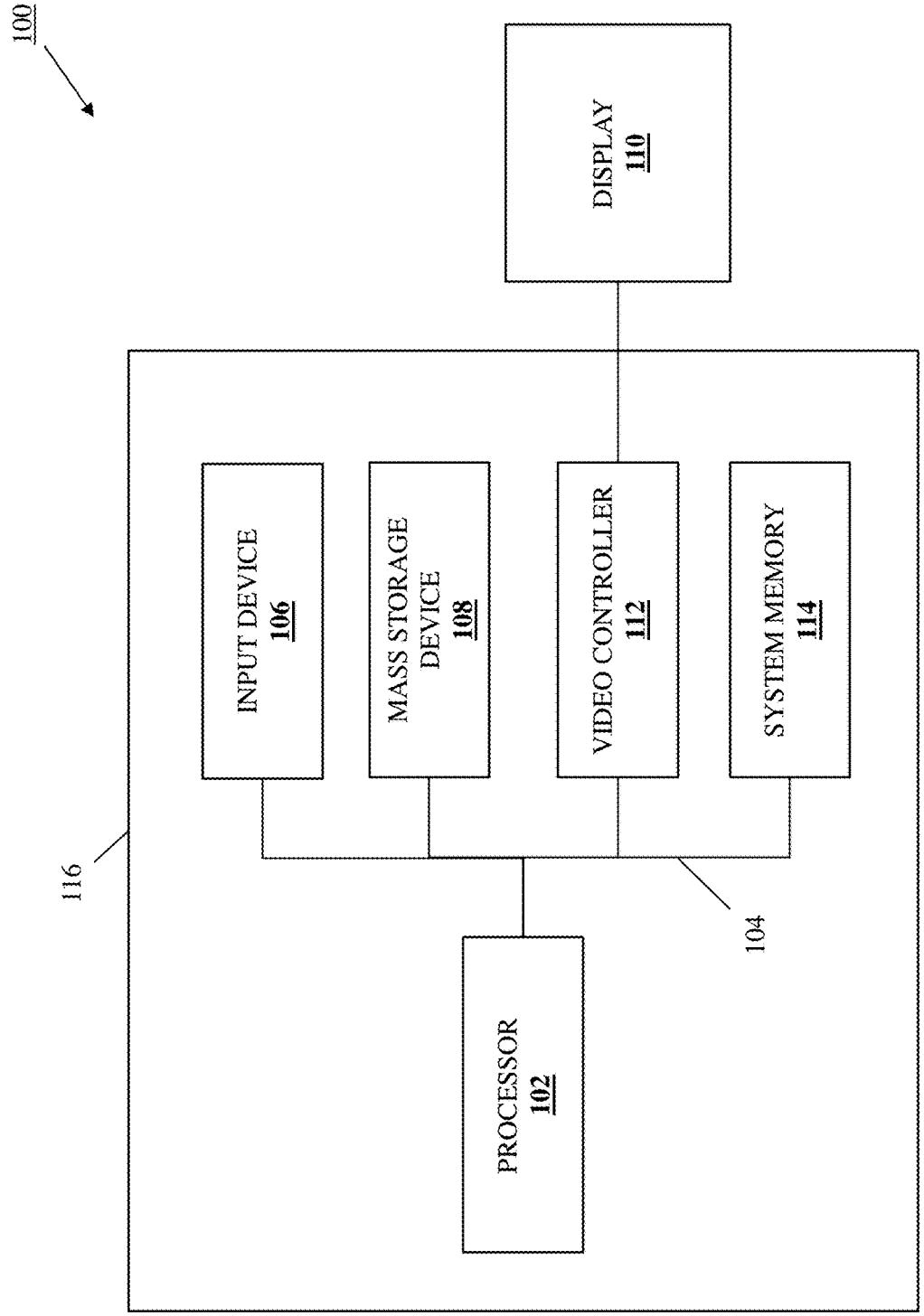
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
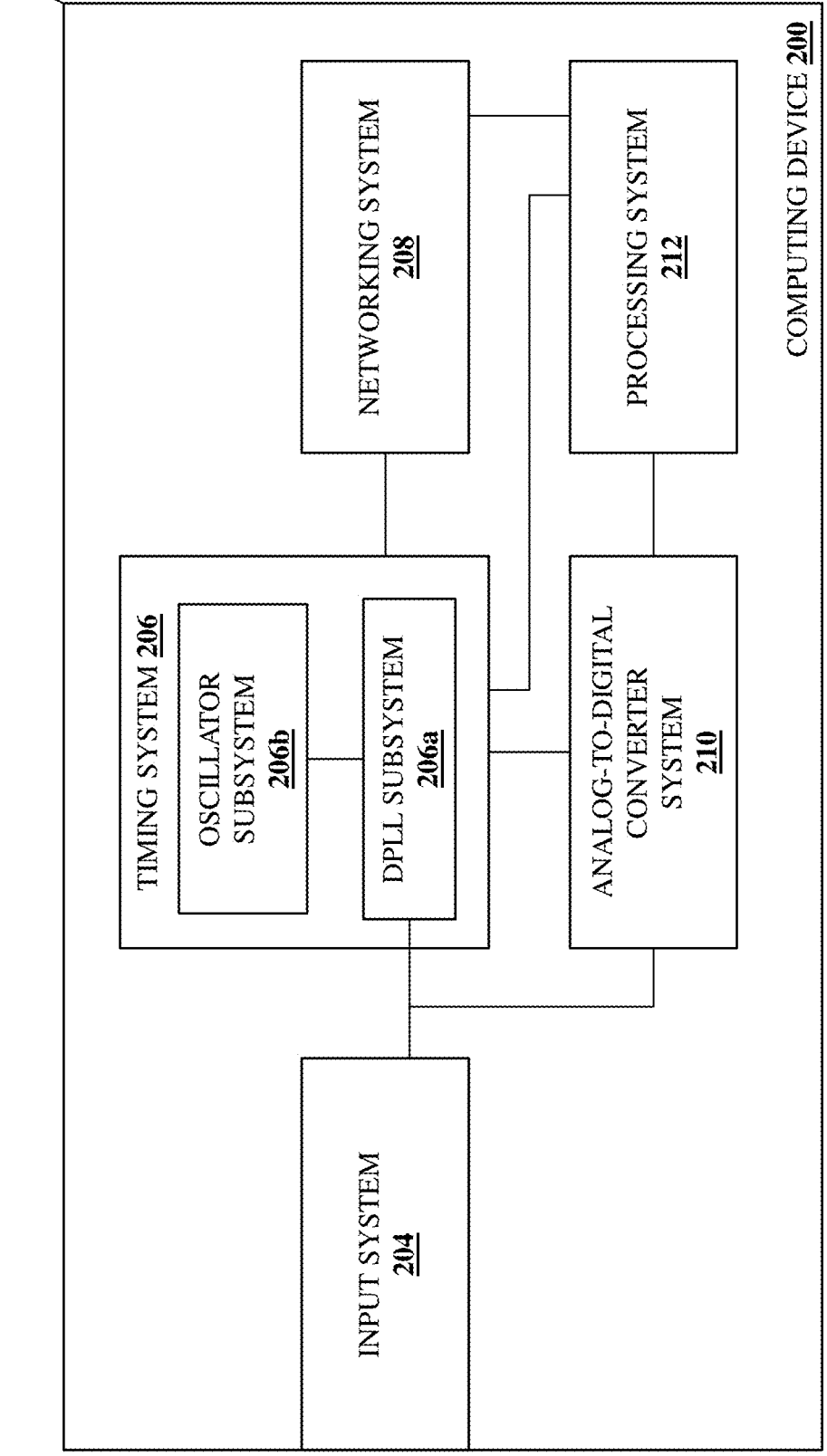
FIG. 2 is a schematic view illustrating an embodiment of a computing device that may include the timing signal diagnostic system of the present disclosure.

Referring now to FIG. 2, an embodiment of a computing device 200 is illustrated that may provide the timing signal diagnostic system of the present disclosure. In an embodiment, the computing device 200 may be provided by the IHS 100 discussed above with reference to FIG. 1 and/or may include some or all of the components of the IHS 100, and in the specific examples below is described as being provided by a server device or a networking device (e.g., a switch device, a router device, etc.). However, while illustrated and discussed as being provided by server devices or networking devices, one of skill in the art in possession of the present disclosure will recognize that the functionality of the computing device 200 discussed below may be provided by other devices that are configured to operate similarly as the computing device 200 discussed below. In the illustrated embodiment, the computing device 200 includes a chassis 202 that houses the components of the computing device 200, only some of which are illustrated and discussed below.

For example, the chassis 202 may house an input system 204 that is included in the chassis 202 and that may include one or more timing ports that are accessible on a surface of the chassis 202. For example, timing port(s) on the input system 204 may be configured according to the G.703 standard promulgated in 2016 by the ITU-T, and may be physically implemented as SMA connectors, SMB connectors, SMC connectors, RJ-45 connectors, and/or via other physical implementations that may depend on the space available in/on the computing device 200. The chassis 202 may also house a timing system 206 that is coupled to the input system 204 (e.g., to the timing ports(s) included on the input system 204).

In the specific example provided in FIG. 2, the timing system 206 is illustrated as including a Digital Phase Locked Loop (DPLL) subsystem 206a that couples the timing system 206 to the input system 204 and that one of skill in the art in possession of the present disclosure will appreciate may be configured to generate an output signal with a phase that is related to a phase of its input signal, as well as an oscillator system 206b that is coupled to the DPLL subsystem 206a and that one of skill in the art in possession of the present disclosure will appreciate may include crystal oscillators such as an Oven Controlled Crystal Oscillator (OCXO) and a Temperature Controlled Crystal Oscillator (TCXO) that are configured to generate clock signals. However, while a specific timing system 206 has been illustrated and described, one of skill in the art in possession of the present disclosure will recognize how the timing system 206 may include other components and/or component configurations for providing the functionality described below while remaining within the scope of the present disclosure as well.

The chassis 202 may also house a networking system 208 that is coupled to the timing system 206 and that may be provided by different networking components depending on the computing device in which it is implemented. For example, in embodiments in which the computing device 200 is provided by a server device, the networking system 208 may be provided by a Network Interface Controller (NIC) device (e.g., an Ethernet NIC device), while in embodiments in which the computing device 200 is provided by a networking device such as a switch device, the networking system 208 may be provided by a switch processing system (e.g., an Ethernet switch chip). However, while a few specific examples have been provided, one of skill in the art in possession of the present disclosure will appreciate how the networking system 208 may be configured in a variety of different manners while remaining within the scope of the present disclosure.

As will be appreciated by one of skill in the art in possession of the present disclosure, in some embodiments the timing system 206 may be configured to use a timing signal received via the input system 204 (discussed in further detail below) for a variety of conventional uses such as, for example, generating and transmitting clock signals and/or reference signals (e.g., with conventional frequencies provided by a 1 pulse-per-second (pps) absolute time reference signal and a 10 megahertz (MHz) frequency reference signal) to the networking system 208 to provide a time-of-day counter for use in time-stamping data packets. However, while a specific conventional use of the timing system 206 has been provided, one of skill in the art in possession of the present disclosure will appreciate how other conventional operations (or only the non-conventional operations described below) may be performed by the timing system 206 while remaining within the scope of the present disclosure as well.

The chassis 202 may also house an analog-to-digital converter system 210 that is coupled to the input system 204 in parallel with the timing system 206, and that one of skill in the art in possession of the present disclosure will appreciate may be configured to convert an analog signal to a digital signal. The chassis 202 may also house a processing system 212 (e.g., a Central Processing Unit (CPU) or other processing system that would be apparent to one of skill in the art in possession of the present disclosure) that is coupled to the analog-to-digital converter system 210 and that, in different embodiments, may be coupled to the timing system 206 directly, and/or via the networking system 208. As such, while the processing system 212 is illustrated as both coupled directly to the timing system 206 and coupled to the timing system 206 via the networking system 208, one of skill in the art in possession of the present disclosure will appreciate how the processing system 212 may be either coupled to the timing system 206 directly, or coupled to the timing system 206 via the networking system 208, while remaining within the scope of the present disclosure.

As will be appreciated by one of skill in the art in possession of the present disclosure, the processing system 212 may be coupled to a memory system (not illustrated, but which may include the memory 114 discussed above with reference to FIG. 1) that includes instructions that, when executed by the processing system 212, cause the processing system 212 to provide a timing signal diagnostic engine that is configured to perform the functionality of the timing signal diagnostic engines, timing signal diagnostic subsystems, and/or processing systems discussed below. However, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the timing signal diagnostic functionality discussed below, while remaining within the scope of the present disclosure as well.

Figure 3:
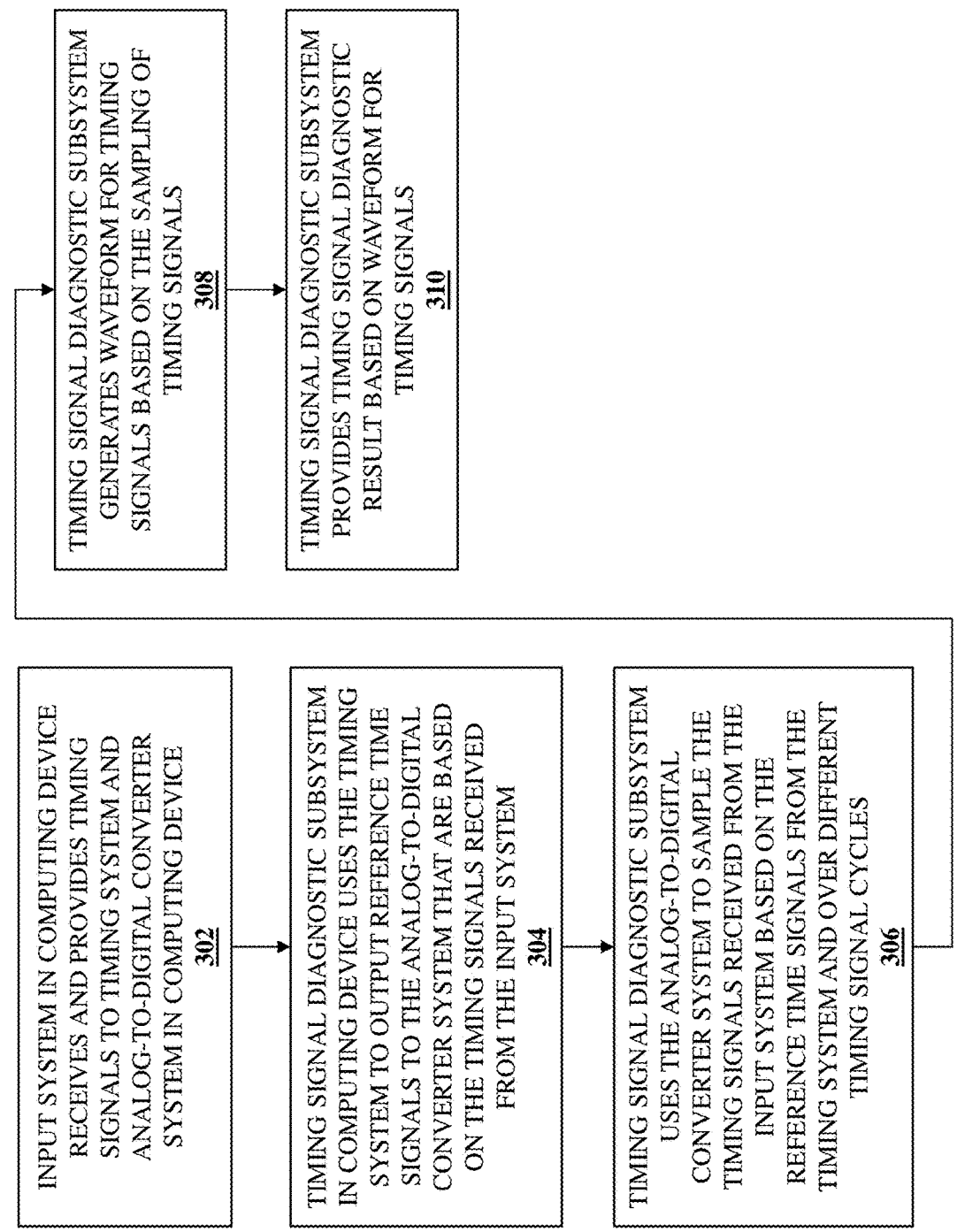
FIG. 3 is a flow chart illustrating an embodiment of a method for diagnosing a timing signal.

Referring now to FIG. 3, an embodiment of a method 300 for diagnosing a timing signal is illustrated. As discussed below, embodiments of the systems and methods of the present disclosure may provide an analog-to-digital converter system in a computing device with an existing timing system, and use the analog-to-digital converter system and the timing system to sample a timing signal received by the computing device and generate a waveform for that timing signal for use in diagnosing that timing signal. For example, the timing signal diagnostic system of the present disclosure may include a chassis housing an input system that receives a timing signal, a timing system that receives the timing signal from the input system, an analog-to-digital converter system that receives the timing signal from the input system, and a processing system that is coupled to the timing system and the analog-to-digital converter system. The processing system uses the timing system to output reference time signals to the analog-to-digital converter system that are based on the timing signal, and uses the analog-to-digital converter system to sample the timing signal based on the reference time signals over a plurality of different timing signal cycles. Based on the sampling of the timing signal, the processing system generates a waveform for the timing signal, and provides a timing signal diagnostic result based on the waveform for the timing signal. As such, timing signal diagnostics may be integrated in computing devices at relatedly low cost by leveraging the existing timing systems in those computing devices.

Figure 4:
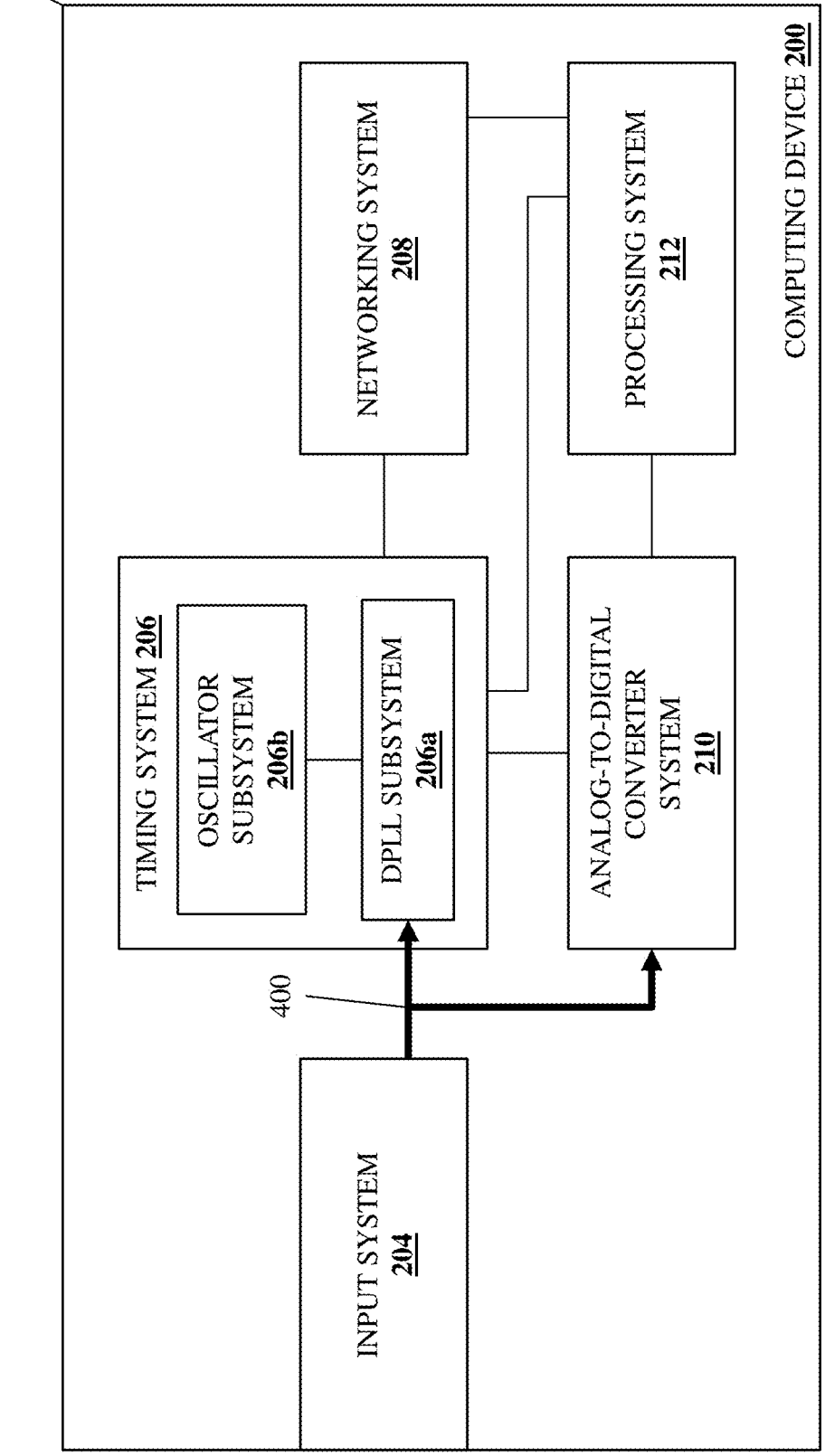
FIG. 4 is a schematic view illustrating an embodiment of the computing device of FIG. 2 operating during the method of FIG. 3.

The method 300 begins at block 302 where an input system in a computing device receives and provides timing signals to a timing system and an analog-to-digital converter system in the computing device. With reference to FIG. 4, in an embodiment of block 302, the input system 204 may perform timing signal transmission operations 400 that may include the input system 204 receiving timing signals (e.g., via a cable (e.g., a coaxial cable) connected to timing port(s) on the input system 204, not illustrated), transmitting those timing signals to the DPLL subsystem 206a in the timing system 206, and transmitting those timing signals to the analog-to-digital converter system 210. As will be appreciated by one of skill in the art in possession of the present disclosure, the timing signal received and transmitted by the input system 204 to the timing system 206 and the analog-to-digital converter system 210 may be provided by a repetitive signal such as the 1 pps absolute time reference signals and/or the 10 MHz frequency reference signals discussed above, although one of skill in the art in possession of the present disclosure will appreciate how timing signals with other characteristics will fall within the scope of the present disclosure as well.

As discussed above, the timing system 206 may be configured to use the timing signal received as part of the timing signal transmission operations 400 for a variety of conventional uses such as, for example, generating and transmitting clock signals and/or reference signals to the networking system 208 to provide a time-of-day counter for use in time-stamping data packets. As discussed below, the timing signal transmission operations 400 that transmit the timing signal to the analog-to-digital converter system 210 allow for the diagnosis of the timing signals received as part of the timing signal transmission operations 400, and that timing signal diagnosis may be initiated on demand, at regular/periodic intervals, and/or in other manners that would be apparent to one of skill in the art in possession of the present disclosure. For example, a network administrator or other user may initiate the timing signal diagnosis discussed below on-demand (e.g., via a network (not illustrated) that is coupled to the timing signal diagnostic engine/subsystem provided by the processing system 212) using a Command Line Interface (CLI) or other user interface known in the art. In another example, the timing signal diagnosis discussed below may be performed regularly/periodically by the timing signal diagnostic engine/subsystem provided by the processing system 212 to automate the diagnosis and detection of any issues with timing signals that are received as part of the timing signal transmission operations 400. However, while a few specific examples have been provided, one of skill in the art in possession of the present disclosure will appreciate how the timing signal diagnosis described herein may be initiated in a variety of manners that will fall within the scope of the present disclosure as well.

Figure 5A:
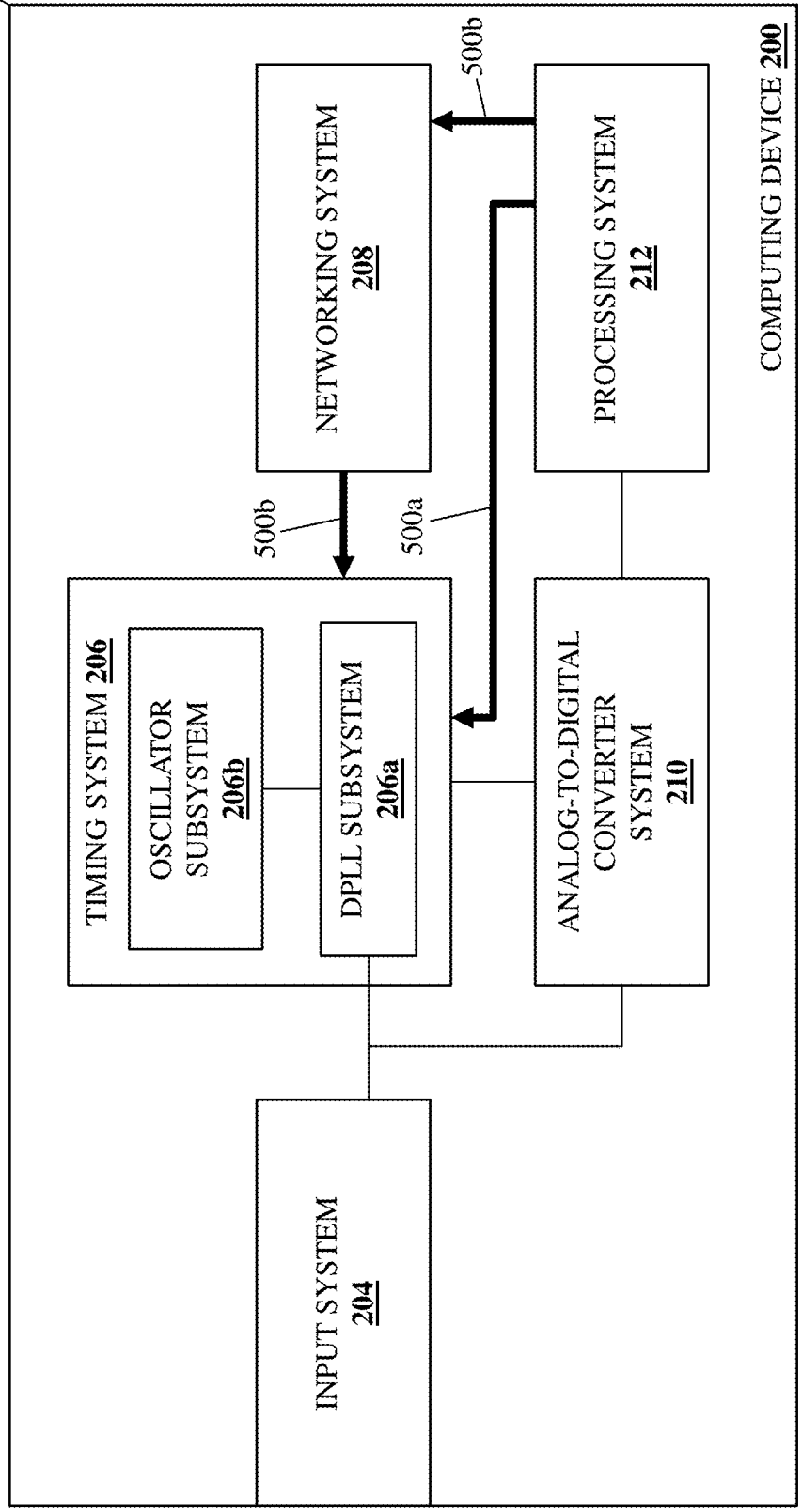
FIG. 5A is a schematic view illustrating an embodiment of the computing device of FIG. 2 operating during the method of FIG. 3.
Figure 5B:
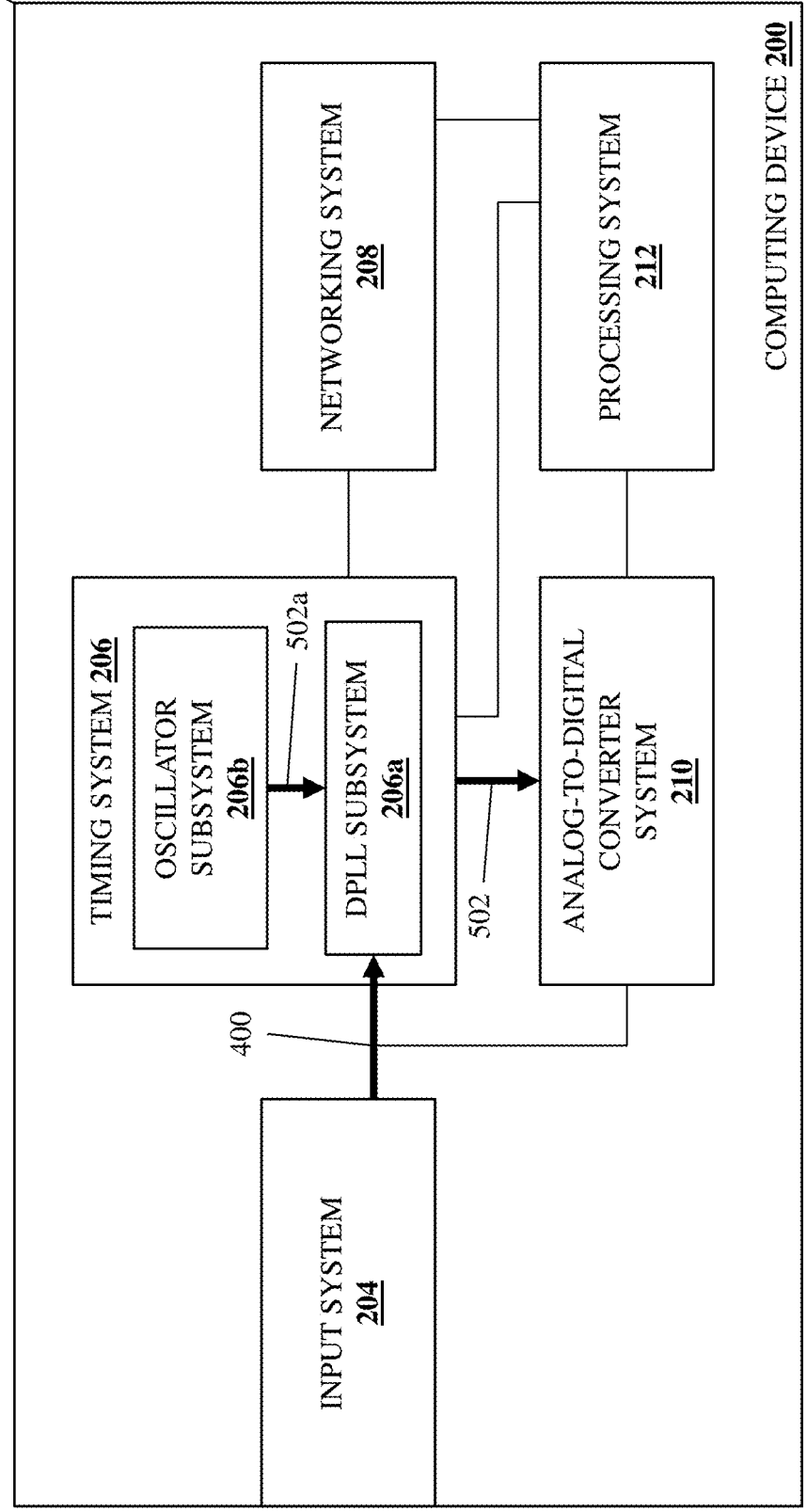
FIG. 5B is a schematic view illustrating an embodiment of the computing device of FIG. 2 operating during the method of FIG. 3.

The method 300 then proceeds to block 304 where a timing signal diagnostic subsystem in the computing device uses the timing system to output reference time signals to the analog-to-digital converter system that are based on the timing signals received from the input system. With reference to FIG. 5A, in an embodiment of block 304, the timing signal diagnostic engine/subsystem provided by the processing system 212 may perform timing system control operations 500a that may include controlling the timing system 206 via its direct connection to the timing system 206, or may perform reference time signal output operations 500b that may include controlling the timing system 206 via the networking system 208. With reference to FIG. 5B, in an embodiment of block 304, the timing system control operations 500a/500b may include controlling the timing system 206 to cause the timing system 206 to perform reference time signal output operations 502 that may include generating reference time signals that are based on the timing signals that are received by the timing system 206 as part of the timing signal transmission operations 400, and outputting those reference time signals to the analog-to-digital converter system 210.

For example, the reference time signal output operations 502 may include the oscillator subsystem 206b in the timing system 206 performing clock signal provisioning operations 502a that include generating and providing a clock signal to the DPLL subsystem 206a in the timing system 206, with the DPLL subsystem 206a identifying a phase of the timing signals that are received by the timing system 206 as part of the timing signal transmission operations 400, and then adjusting a phase of the clock signal generated by the oscillator subsystem 206b based on the phase of the timing signals in order to generate the reference time signal that is then output to the analog-to-digital converter system 210 at block 304. As will be appreciated by one of skill in the art in possession of the present disclosure, the DPLL subsystem 206a in the timing system 206 may include relatively high-precision phase shift capabilities with respect to the reference time signal it outputs to the analog-to-digital converter system 210, and thus may adjust the phase of the clock signal generated by the oscillator subsystem 206b relative to the phase of the timing signal received from the input system 204 and back and forth across a "zero phase offset" value (i.e., a value at which the phases of the timing signals and the clock signal match) in order to "sweep" the timing signals during the sampling described below. However, while a specific example of the reference time signals output by the timing system 206 to the analog-to-digital converter system 210 has been described, one of skill in the art in possession of the present disclosure will appreciate how other reference time signals will fall within the scope of the present disclosure as well.

Figure 6A:
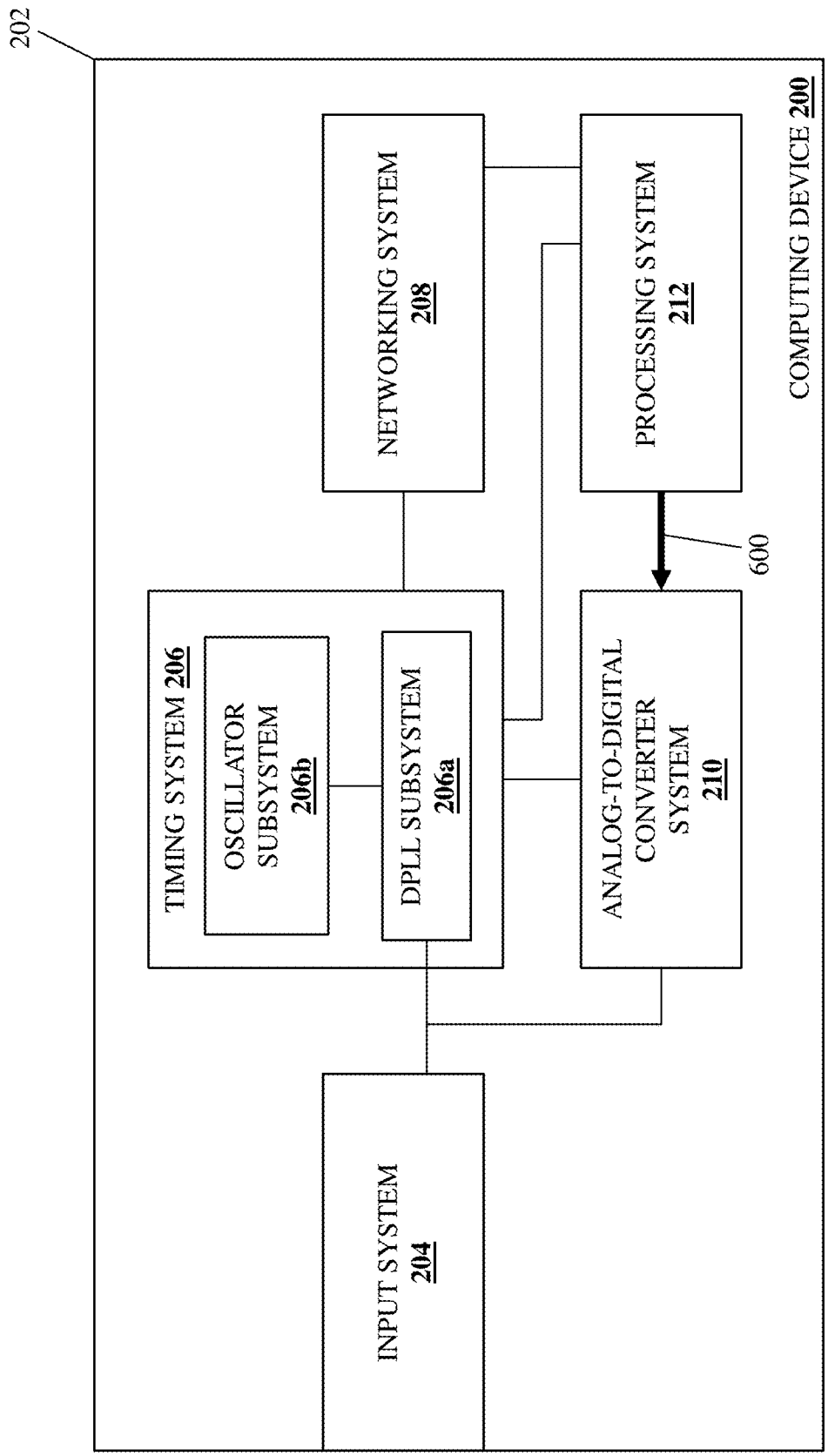
FIG. 6A is a schematic view illustrating an embodiment of the computing device of FIG. 2 operating during the method of FIG. 3.
Figure 6B:
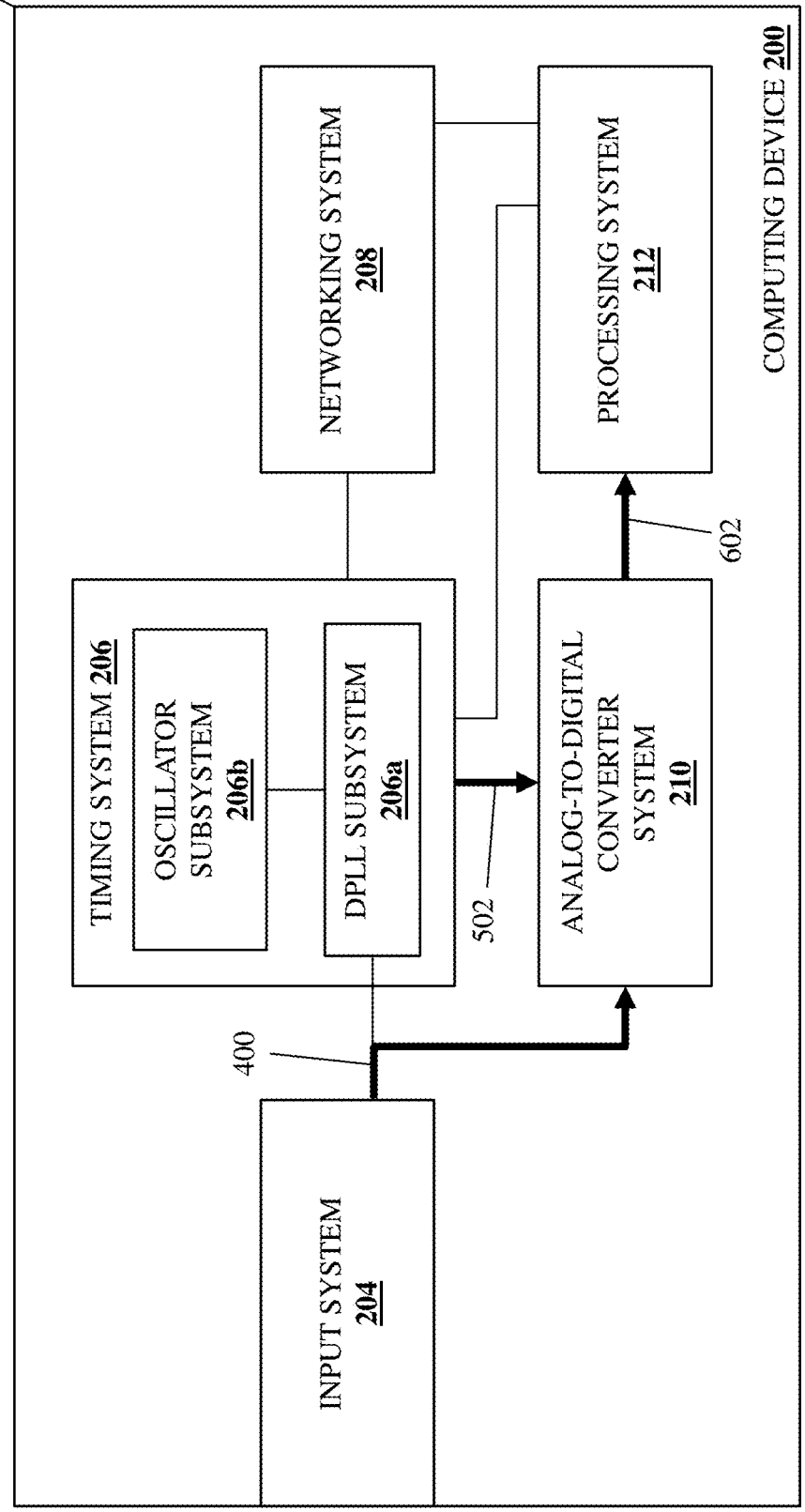
FIG. 6B is a schematic view illustrating an embodiment of the computing device of FIG. 2 operating during the method of FIG. 3.

The method 300 then proceeds to block 306 where the timing signal diagnostic subsystem uses the analog-to-digital converter system to sample the timing signals received from the input system based on the reference time signals from the timing system and over different timing signal cycles. With reference to FIG. 6A, in an embodiment of block 306, the timing signal diagnostic engine/subsystem provided by the processing system 212 may perform analog-to-digital system control operations 600 that may include controlling the analog-to-digital converter system 210 to sample the timing signal received by the analog-to-digital converter system 210 as part of the timing signal transmission operations 400. With reference to FIG. 6B, in an embodiment of block 306, the analog-to-digital system control operations 600 may include controlling the analog-to-digital converter system 210 to cause the analog-to-digital converter system 210 to perform timing signal sample output operations 602 that may include generating timing signal samples that are based on the timing signals that are received by the analog-to-digital converter system 210 as part of the timing signal transmission operations 400, and outputting those timing signal samples to the timing signal diagnostic engine/subsystem provided by the processing system 212.

For example, the timing signal sample output operations 602 may include the analog-to-digital converter system 210 receiving the timing signals from the input system 204 as part of the timing signal transmission operations 400, receiving the reference time signals from the timing system 206 as part of the reference time signal output operations 502, and then performing timing signal sampling operations on the timing signals using the reference time signals. As will be appreciated by one of skill in the art in possession of the present disclosure the timing signal sampling operations performed by the analog-to-digital converter system 210 discussed below may utilize a timing reference provided by the timing system 206 that is already present in many computing devices, and the leveraging of such existing local timing references in computing devices allows for the implementation of the integrated timing signal diagnostic system of the present disclosure at relatively low cost (e.g., using the relatively low cost analog-to-digital converter system 210 described herein).

Figure 7:
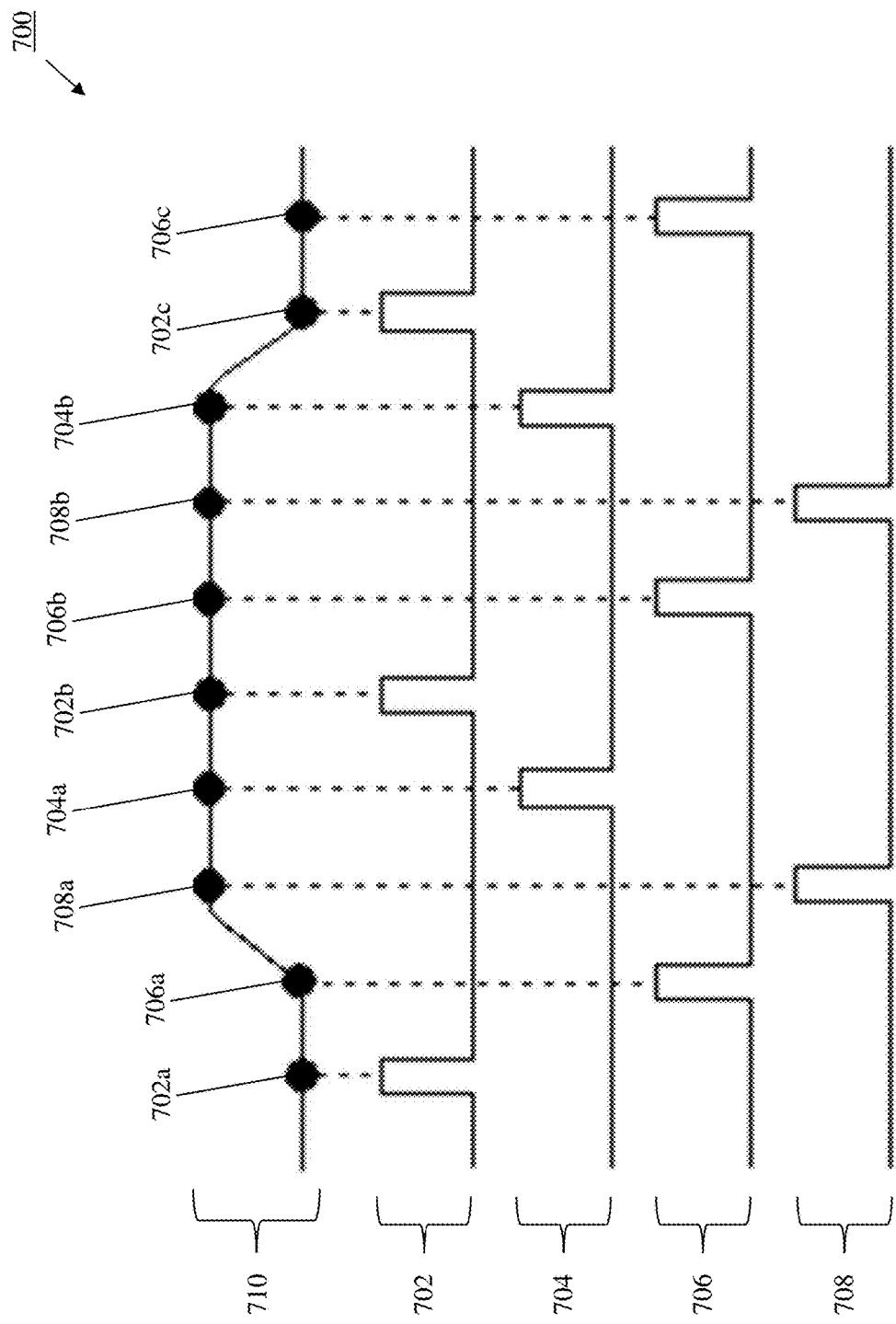
FIG. 7 is a graph view illustrating an embodiment of the operation of computing device of FIG. 2 during the method of FIG. 3.

With reference to FIG. 7, a simplified embodiment of the timing signal sampling operations 700 performed at block 306 is illustrated that one of skill in the art in possession of the present disclosure will appreciate utilizes "equivalent time sampling" techniques that provide for the gathering of samples across a plurality of cycles of a repetitive input signal in order to allow a waveform to be generated for that input signal. For example, the time sampling operations 700 illustrated in FIG. 7 include a plurality of cycles 702, 704, 706, and up to 708 of an analog input signal that are sampled in order to generate digital values for the samples taken of that analog input signal that may be used to generate a waveform 710 for that analog input signal (discussed below). As illustrated, samples 702a, 702b, and 702c may be taken during the cycle 702; samples 704a and 704b may be taken during the cycle 704; samples 706a, 706b, and 706c may be taken during the cycle 706; and samples 708a and 708b may be taken during the cycle 708, with the reference time signals received as part of the reference time signal output operations 502 used as a relatively high precision/accurate time reference that identifies the time each sample was taken. As will be appreciated by one of skill in the art in possession of the present disclosure, such equivalent time sampling techniques may improve the accuracy of relatively low-cost signal measurement systems by averaging samples over time, lowering signal-to-noise ratios, and improving voltage resolution, as well as spreading samples over time, increasing effective sampling rates, and improving timing resolution.

As discussed above, the reference time signals may be generated by the timing system 206 to "sweep" the timing signals received from the input system 204 as part of the timing signal transmission operations 400, and may be used during the timing signal sampling operations (e.g., using the equivalent time sampling techniques discussed above) to generate the time signal samples that are output to the timing signal diagnostic engine/subsystem provided by the processing system 212 as part of the timing signal sample output operations 602. However, while specific sampling techniques have been illustrated and described, one of skill in the art in possession of the present disclosure will appreciate how other sampling techniques may be used to generate samples of the timing signals while remaining within the scope of the present disclosure as well.

The method 300 then proceeds to block 308 where the timing signal diagnostic subsystem generates a waveform for the timing signals based on the sampling of the timing signals. In an embodiment, at block 308, the timing signal diagnostic engine/subsystem provided by the processing system 212 may receive the timing signal samples as part of the timing signal sample output operations 602, and may use those timing signal samples to generate a waveform for the timing signals received at the input system 204. As discussed above, the timing signal samples of the timing signal received at the input system 204 may be generated and output by the analog-to-digital converter system 210 as digital values for samples taken of the repeating analog timing signals over a plurality of cycles, and one of skill in the art in possession of the present disclosure will appreciate how the timing signal diagnostic engine/subsystem provided by the processing system 212 may use those digital values/timing signal samples to generate a waveform for those timing signals (e.g., similarly as described above for the waveform 710 generated for the input signal as discussed above with reference to FIG. 7).

Figure 8A:
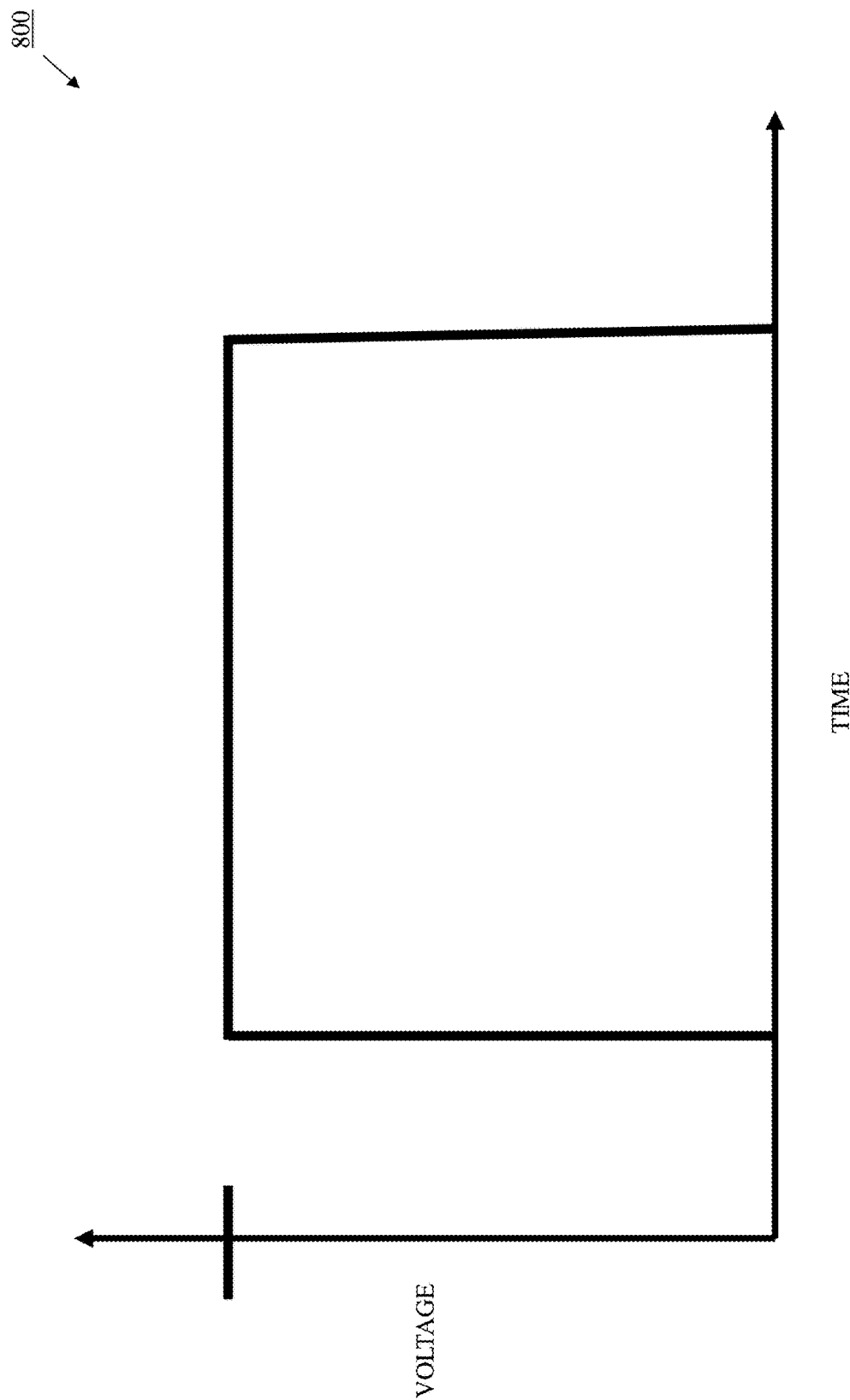
FIG. 8A is a graph view illustrating an embodiment of results of the operation of computing device of FIG. 2 during the method of FIG. 3.
Figure 8B:
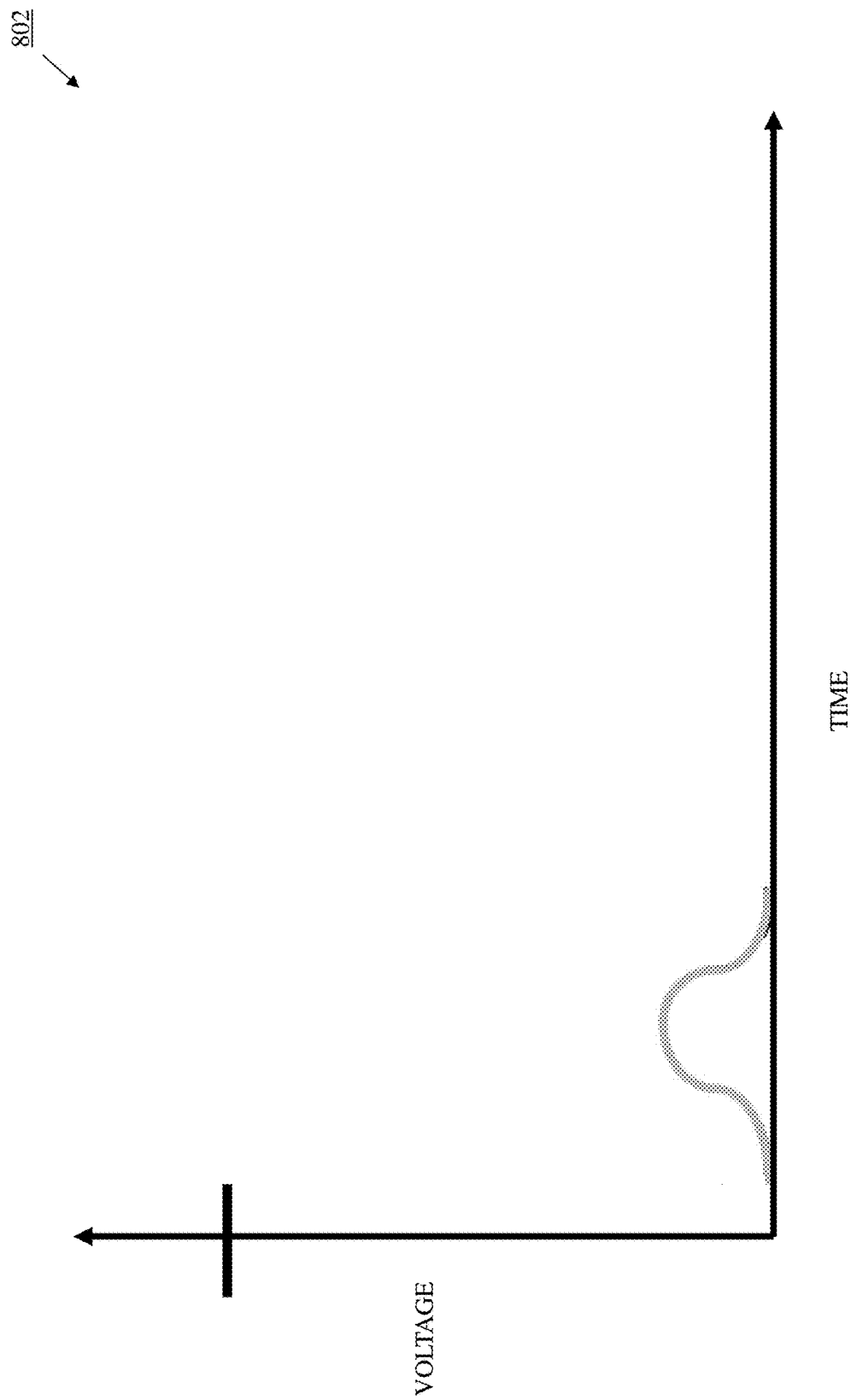
FIG. 8B is a graph view illustrating an embodiment of results of the operation of computing device of FIG. 2 during the method of FIG. 3.
Figure 8C:
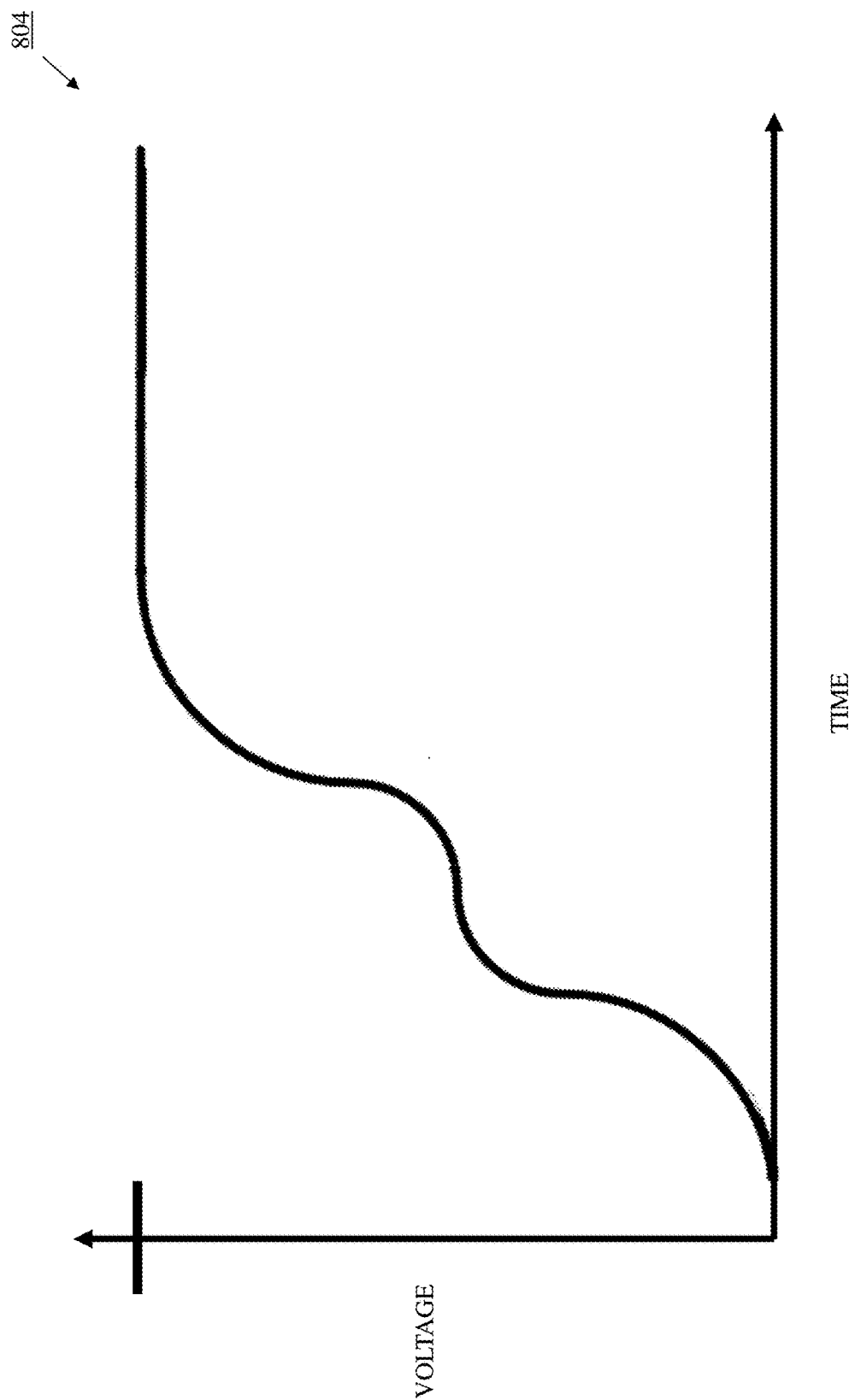
FIG. 8C is a graph view illustrating an embodiment of results of the operation of computing device of FIG. 2 during the method of FIG. 3.

With reference to FIG. 8A, an embodiment of a waveform 800 is illustrated that one of skill in the art in possession of the present disclosure will recognize provides an example of an "ideal" waveform for timing signals (e.g., a "square" wave for each timing pulse) that may be generated at block 308. However, as discussed above, a variety of issues can degrade timing signals such that they do not provide the ideal waveform illustrated in FIG. 8A. For example, with reference to FIG. 8B, an embodiment of a "non-ideal" waveform 802 is illustrated that one of skill in the art in possession of the present disclosure will recognize provides an example of an "runt pulse" waveform for timing signals that may be generated at block 308 (with FIG. 8C illustrating a "positive" runt pulse that may reach a lower maximum voltage level than adjacent pulses, and with "negative" runt pulses that not reach a lower maximum voltage level of adjacent pulses). With reference to FIG. 8C, another embodiment of a "non-ideal" waveform 804 is illustrated that one of skill in the art in possession of the present disclosure will recognize provides an example of an "rising edge with edge shelf" waveform for timing signals that may be generated at block 308.

Figure 8D:
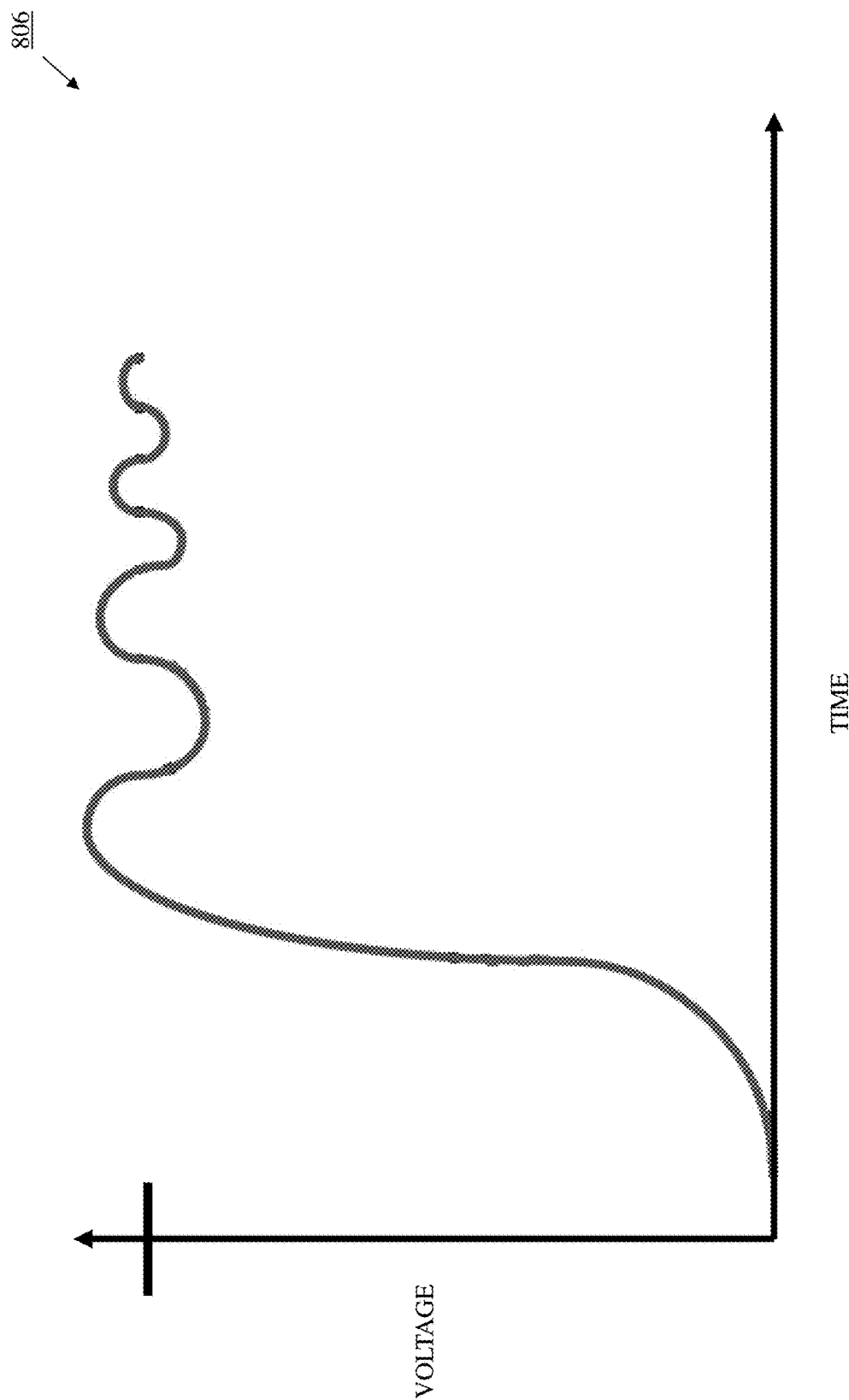
FIG. 8D is a graph view illustrating an embodiment of results of the operation of computing device of FIG. 2 during the method of FIG. 3.
Figure 8E:
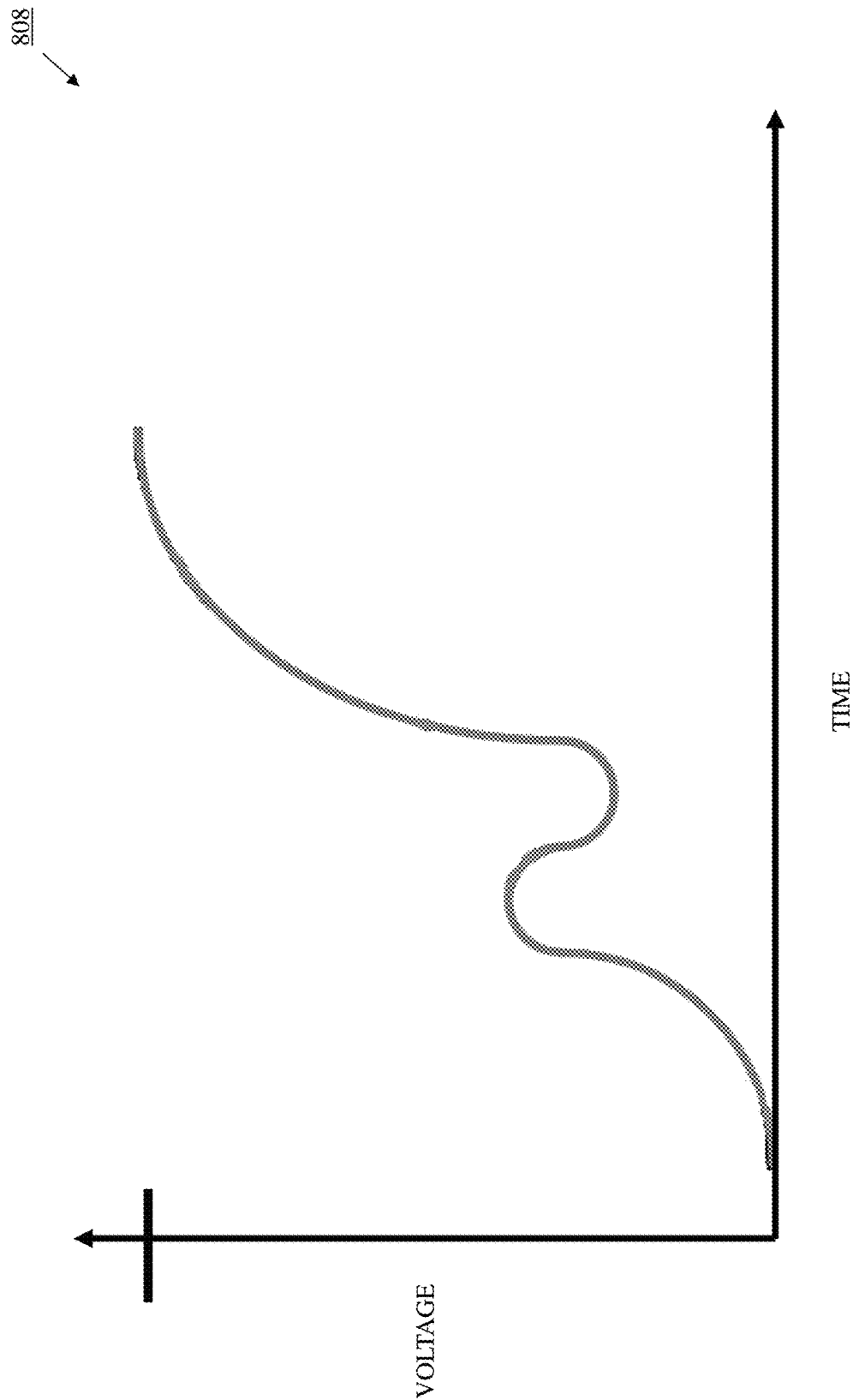
FIG. 8E is a graph view illustrating an embodiment of results of the operation of computing device of FIG. 2 during the method of FIG. 3.

With reference to FIG. 8D, another embodiment of a "non-ideal" waveform 806 is illustrated that one of skill in the art in possession of the present disclosure will recognize provides an example of an "excessive ringing" waveform for timing signals that may be generated at block 308. With reference to FIG. 8E, another embodiment of a "non-ideal" waveform 808 is illustrated that one of skill in the art in possession of the present disclosure will recognize provides an example of an "non-monotonic rising edge" waveform for timing signals that may be generated at block 308. With reference to FIG. 8F, another embodiment of a "non-ideal" waveform 810 is illustrated that one of skill in the art in possession of the present disclosure will recognize provides an example of an "low amplitude" waveform for timing signals that may be generated at block 308. As discussed above, any of the "non-ideal" waveforms 802-810 for the timing signals illustrated in FIGS. 8B-8F may result in a failure of the timing reference provided by the timing system 206 using those timing signals, and conventional time signal diagnosis techniques require the timing reference failure to first be identified, and then the timing signal cabling to be physically disconnected from the computing device 200 and connected to an oscilloscope in order to generate the waveforms required to detect and debug the issues resulting in the timing signal degradation.

The method 300 then proceeds to block 310 where the timing signal diagnostic subsystem provides a timing signal diagnostic result based on the waveform for the timing signals. In an embodiment, at block 310, the timing signal diagnostic engine/subsystem provided by the processing system 212 may provide a timing signal diagnostic result based on the waveform generated for the timing signals at block 308 by generating a waveform image of that waveform for the timing signals that provides the timing signal diagnostic result, and then providing that waveform image/timing signal diagnostic result for display on a display device that is coupled to the processing system 212 (e.g., the display 110 discussed above with reference to FIG. 1). As will be appreciated by one of skill in the art in possession of the present disclosure, a network administrator or other user may then view the waveform image to diagnose and address any issues with the timing signals that produced that waveform.

In another embodiment, at block 310, the timing signal diagnostic engine/subsystem provided by the processing system 212 may provide a timing signal diagnostic result based on the waveform generated for the timing signals at block 308 by comparing the waveform generated for the timing signals at block 308 to a desired timing signal waveform (e.g., the "ideal" waveform 800 discussed above with reference to FIG. 8A), determining whether the waveform generated for the timing signals at block 308 differs from a desired timing signal waveform by a threshold amount and, if so, generating and/or transmitting a degraded timing signal alert. As will be appreciated by one of skill in the art in possession of the present disclosure, the threshold amount a waveform must differ from a desired timing signal waveform may be defined such that waveforms of timing signals that will cause a timing reference to fail may be detected and a degraded timing signal alert to be generated/transmitted. As such, any of the "non-ideal" waveforms 802-810 for timing signals illustrated in FIGS. 8B-8F generated at block 308 may be compared to the "ideal" waveform 800 illustrated in FIG. 8A, determined to differ from that "ideal" waveform 800 by a threshold amount, and result in the generation/transmission of a degraded timing signal alert.

Thus, systems and methods have been described that provide an analog-to-digital converter system in a computing device, and use the analog-to-digital converter system with a timing system in the computing device to sample a timing signal received by the computing device and generate a waveform for that timing signal for use in diagnosing that timing signal. For example, the timing signal diagnostic system of the present disclosure may include a chassis housing an input system that receives a timing signal, a timing system that receives the timing signal from the input system, an analog-to-digital converter system that receives the timing signal from the input system, and a processing system that is coupled to the timing system and the analog-to-digital converter system. The processing system uses the timing system to output reference time signals to the analog-to-digital converter system that are based on the timing signal, and uses the analog-to-digital converter system to sample the timing signal based on the reference time signals over a plurality of different timing signal cycles. Based on the sampling of the timing signal, the processing system generates a waveform for the timing signal, and provides a timing signal diagnostic result based on the waveform for the timing signal. As will be appreciated by one of skill in the art in possession of the present disclosure, many computing devices already include an internal timing system that provides a relatively precise/highly accurate time reference, and that timing system may be utilized with the analog-to-digital converter device to provide integrated timing signal diagnostics in computing devices at relatedly low cost.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A timing signal diagnostic system, comprising:
a chassis;
an input system that is included in the chassis and configured to receive a timing signal;
a timing system that is included in the chassis, coupled to the input system, and configured to receive the timing signal from the input system;
an analog-to-digital converter system that is included in the chassis, coupled to the input system, and configured to receive the timing signal from the input system; and
a processing system that is included in the chassis, coupled to the timing system and the analog-to-digital converter system, and configured to:
output, to the analog-to-digital converter system using the timing system, reference time signals that are based on the timing signal;
sample, using the analog-to-digital converter system, the timing signal based on the reference time signals over a plurality of different timing signal cycles;
generate, based on the sampling of the timing signal, a waveform for the timing signal; and
provide, based on the waveform for the timing signal, a timing signal diagnostic result.

2. The system of claim 1, wherein the timing signal diagnostic result includes an image of the waveform for the timing signal, and wherein the processing system is configured to:
provide the image of the waveform for the timing signal for display on a display device.

3. The system of claim 1, wherein the providing the timing signal diagnostic result includes:
determining that the waveform for the timing signal differs from a desired timing signal waveform by a threshold amount and, in response, transmitting a degraded timing signal alert.

4. The system of claim 1, wherein the outputting the reference time signals that are based on the timing signal to the analog-to-digital converter system using the timing system includes:
outputting, to the analog-to-digital converter system using the timing system, reference time signals having different phases.

5. The system of claim 1, wherein the sampling the timing signal based on the reference time signals over the plurality of different timing signal cycles using the analog-to-digital converter system includes the analog-to-digital converter system sampling an analog signal provided by the timing signal using the reference time signals and generating digital values, and wherein the generating the waveform for the timing signal based on the sampling of the timing signal includes building the waveform for the timing signal using the digital values.

6. The system of claim 1, further comprising:
a networking system that is coupled to the timing system, wherein the timing system includes a Digital Phase Locked Loop (DPLL) subsystem and an oscillator subsystem that are configured to use the timing signal to provide a time-of-day counter for use in time-stamping data packets to the networking system.

7. An Information Handling System (IHS), comprising:
a processing system; and
a memory system that is coupled to the processing system and that includes instructions that, when executed by the processing system, cause the processing system to provide a timing signal diagnostic engine that is configured to:
output, to an analog-to-digital converter system that is included in a chassis with the processing system using a timing system that is included in the chassis with the processing system, reference time signals that are based on a timing signal that is received by the timing system from an input system that is included in the chassis with the processing system;
sample, using the analog-to-digital converter system and based on the reference time signals over a plurality of different timing signal cycles, the timing signal that is received by the analog-to-digital converter system from the input system;
generate, based on the sampling of the timing signal, a waveform for the timing signal; and
provide, based on the waveform for the timing signal, a timing signal diagnostic result.

8. The IHS of claim 7, wherein the timing signal diagnostic result includes an image of the waveform for the timing signal, and wherein the timing signal diagnostic engine is configured to:
provide the image of the waveform for the timing signal for display on a display device.

9. The IHS of claim 7, wherein the providing the timing signal diagnostic result includes:
determining that the waveform for the timing signal differs from a desired timing signal waveform by a threshold amount and, in response, transmitting a degraded timing signal alert.

10. The IHS of claim 7, wherein the outputting the reference time signals that are based on the timing signal to the analog-to-digital converter system using the timing system includes:
outputting, to the analog-to-digital converter system using the timing system, reference time signals having different phases.

11. The IHS of claim 7, wherein the sampling the timing signal based on the reference time signals over the plurality of different timing signal cycles using the analog-to-digital converter system includes the analog-to-digital converter system sampling an analog signal provided by the timing signal using the reference time signals and generating digital values, and wherein the generating the waveform for the timing signal based on the sampling of the timing signal includes building the waveform for the timing signal using the digital values.

12. The IHS of claim 7, wherein the timing system includes a Digital Phase Locked Loop (DPLL) subsystem and an oscillator subsystem that are configured to use the timing signal to provide a time-of-day counter for use in time-stamping data packets to a networking system that is included in the chassis with the processing system.

13. The IHS of claim 7, wherein the timing signal diagnostic engine is configured to be remotely activated via a network connected to the processing system.

14. A method for diagnosing a timing signal, comprising:
outputting, by a timing signal diagnostic subsystem to an analog-to-digital converter system that is included in a chassis with the timing signal diagnostic subsystem using a timing system that is included in the chassis with the timing signal diagnostic subsystem, reference time signals that are based on a timing signal that is received by the timing system from an input system that is included in the chassis with the timing signal diagnostic subsystem;
sampling, by the timing signal diagnostic subsystem using the analog-to-digital converter system and based on the reference time signals over a plurality of different timing signal cycles, the timing signal that is received by the analog-to-digital converter system from the input system;
generating, by the timing signal diagnostic subsystem based on the sampling of the timing signal, a waveform for the timing signal; and
providing, by the timing signal diagnostic subsystem based on the waveform for the timing signal, a timing signal diagnostic result.

15. The method of claim 14, wherein the timing signal diagnostic result includes an image of the waveform for the timing signal, and wherein the method includes:
Providing, by the timing signal diagnostic subsystem, the image of the waveform for the timing signal for display on a display device.

16. The method of claim 14, wherein the providing the timing signal diagnostic result includes:
determining that the waveform for the timing signal differs from a desired timing signal waveform by a threshold amount and, in response, transmitting a degraded timing signal alert.

17. The method of claim 14, wherein the outputting the reference time signals that are based on the timing signal to the analog-to-digital converter system using the timing system includes:
outputting, to the analog-to-digital converter system using the timing system, reference time signals having different phases.

18. The method of claim 14, wherein the sampling the timing signal based on the reference time signals over the plurality of different timing signal cycles using the analog-to-digital converter system includes the analog-to-digital converter system sampling an analog signal provided by the timing signal using the reference time signals and generating digital values, and wherein the generating the waveform for the timing signal based on the sampling of the timing signal includes building the waveform for the timing signal using the digital values.

19. The method of claim 14, wherein the timing system includes a Digital Phase Locked Loop (DPLL) subsystem and an oscillator subsystem that are configured to use the timing signal to provide a time-of-day counter for use in time-stamping data packets to a networking system that is included in the chassis with the processing system.

20. The method of claim 14, wherein the timing signal diagnostic subsystem is remotely activated via a network connected to the timing signal diagnostic subsystem.

\* \* \* \* \*